(12) United States Patent
Hollocher et al.

(10) Patent No.: US 7,956,621 B2
(45) Date of Patent: Jun. 7, 2011

(54) ANTI-CAPTURE METHOD AND APPARATUS FOR MICROMACHINED DEVICES

(75) Inventors: David C. Hollocher, Norwood, MA (US); Howard R. Samuels, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 542 days.

(21) Appl. No.: 12/137,221

(22) Filed: Jun. 11, 2008

(65) Prior Publication Data

US 2009/0309613 A1  Dec. 17, 2009

(51) Int. Cl.
*G01P 15/125* (2006.01)
*H01G 5/011* (2006.01)
*G01R 27/26* (2006.01)

(52) U.S. Cl. ............ 324/661; 324/676; 73/514.32; 361/277

(58) Field of Classification Search ............ 324/661, 324/660; 361/277
See application file for complete search history.

(56) References Cited

U.S. PATENT DOCUMENTS

| | | | |
|---|---|---|---|
| 4,504,803 A | 3/1985 | Lee et al. ............... | 332/31 R |
| 4,504,804 A | 3/1985 | Chang et al. ........... | 332/31 R |
| 5,345,824 A | 9/1994 | Sherman et al. ........ | 73/517 B |
| 5,511,420 A | 4/1996 | Zhao et al. ............. | 73/514.18 |
| 5,623,432 A * | 4/1997 | Degrauwe .............. | 713/321 |
| 5,659,262 A | 8/1997 | Memishian ............. | 327/307 |
| 5,748,004 A | 5/1998 | Kelly et al. ............ | 324/661 |
| 5,798,748 A * | 8/1998 | Hilton et al. ........... | 345/156 |
| 6,223,598 B1 | 5/2001 | Judy ..................... | 73/514.32 |
| 6,530,275 B1 | 3/2003 | Hollocher et al. ...... | 73/514.18 |
| 6,718,825 B1 | 4/2004 | Platt et al. ............. | 73/514.32 |
| 6,761,069 B2 | 7/2004 | Hollocher et al. ...... | 73/514.18 |
| 6,809,527 B2 * | 10/2004 | Ishio et al. ............. | 324/661 |
| 7,340,955 B2 * | 3/2008 | Manninen ............... | 73/514.32 |
| 7,640,803 B1 * | 1/2010 | Gutierrez et al. ....... | 73/504.04 |
| 2006/0112765 A1 * | 6/2006 | Malvern ................. | 73/514.32 |
| 2008/0000296 A1 * | 1/2008 | Johnson ................. | 73/514.18 |
| 2008/0218182 A1 * | 9/2008 | Gao et al. .............. | 324/676 |

OTHER PUBLICATIONS

Authorized Officer Philippe Foussier, International Search Report and the Written Opinion of the International Search Authority, or the Declaration; PCT/US2009/046119; Sep. 10, 2010 [2550/B80WO].
Authorized Officer Philippe Foussier, Written Opinion of the International Searching Authority; PCT/US2009/046119; Sep. 10, 2010 [2550/B80WO].

* cited by examiner

*Primary Examiner* — Timothy J Dole
*Assistant Examiner* — John Zhu
(74) *Attorney, Agent, or Firm* — Sunstein Kann Murphy & Timbers LLP (57) ABSTRACT

A MEMS device has a movable beam, a differential capacitor with a movable electrode that moves in response to the displacement of the movable beam and that is disposed between two stationary electrodes, and a voltage circuit for applying a first voltage to the first stationary electrode, second voltage to the second stationary electrode, and a third voltage to the movable electrode. The MEMS device also has a monitor operably coupled with the movable beam to monitor the displacement of the movable beam. In some embodiments, the monitor may monitor the distance between the movable electrode and at least one of the stationary electrodes. The MEMS device further has a voltage reducing circuit operatively coupled with the monitor, the movable electrode, and the stationary electrodes. The voltage reducing circuit reduces the differential between the third voltage and the voltages on the stationary electrodes when the monitor detects that the displacement of the movable beam is greater than or equal to a threshold value.

16 Claims, 12 Drawing Sheets

Figure 1A: Prior Art Differential Capacitor Cell

Figure 1B: Prior Art Differential Capacitor Cell

Fig. 2

Fig. 3 Prior art accelerometer

Fig. 4 Prior art accelerometer

Fig. 5 Prior art mechanical stoppers

ANTI-CAPTURE METHOD AND APPARATUS FOR MICROMACHINED DEVICES

FIELD OF THE INVENTION

The invention generally relates to micromachined devices and, more particularly, the invention relates to improving the performance and robustness of micromachined devices.

BACKGROUND OF THE INVENTION

Some micro-electromechanical systems ("MEMS" or "MEMS devices") can be used to detect motion, such as acceleration (e.g., an accelerometer) or rotation (e.g., a gyroscope). Some MEMS devices may include a mass (or "beam") that is movable relative to another portion of the MEMS device (e.g., a substrate), and will displace in response to a motion. The motion of the MEMS device can be detected by a change in capacitance of one or more capacitors within the MEMS device, where the capacitance varies as a function of the displacement of the beam. For example, the beam may be suspended over an electrode on the substrate, and the beam and substrate electrode may form a capacitor, such that a change in that capacitance may be used to detect a change in the gap between the beam and substrate electrode.

Some MEMS devices employ one or more differential capacitors to detect displacement of a movable mass. A differential capacitor includes at least two electrodes. Specifically, one electrode is in a fixed position relative to the substrate or other part of the MEMS devices, while a movable electrode is part of, and moves with, the beam. The capacitor is defined, in part, by the gap between its fixed electrode and the movable electrode.

In one type of micromachined device, a beam is suspended over a substrate by supporting tethers (see e.g. U.S. Pat. No. 6,223,598). The supporting tethers act as springs, allowing the movable mass to move laterally relative to the substrate along an axis when the MEMS device is subject to the external force/acceleration. The supporting tethers also apply a restorative force counter to the external force, which normally pulls the beam back towards its nominal position. In normal operation, the displacement is small and the spring force of the tethers will restore the beam to its nominal, centered position.

The beam may be elongated along an axis, and may have a number of fingers that extend away from the beam in a direction perpendicular to the elongated axis of the beam and parallel to the substrate. The beam and fingers may displace laterally relative to the substrate along the axis, in response to an acceleration along the axis. Each of these movable fingers may be positioned between two fingers that are in the plane of the mass and are fixed relative to the substrate or some other part of the MEMS device. Each movable finger is an electrode, and each fixed finger is an electrode, and together a movable finger and a fixed finger form a capacitor. Together, the three electrodes form a differential capacitor cell.

In response to an external force/acceleration along a sensitive axis, the beam with a movable finger moves toward one or the other of the fixed fingers. The capacitance of the individual capacitors will change according to the displacement of the movable finger.

A variety of approaches can be used to sense the displacement of the beam with such a differential capacitor. Several approaches are described, for example, in U.S. Pat. No. 5,345,824.

In one type of prior art accelerometer, for example, the two fixed fingers in a differential capacitor are driven with AC carrier signals, such as sinusoids or square waves, that are preferably 180 degrees out of phase with respect to each other. If the beam is not displaced from its nominal position, no signal will be induced on the beam from the signals on the fixed fingers. However, if the beam has been displaced from its nominal position, for example by an acceleration, the change in the capacitances discussed above will cause a signal from the fixed electrodes to appear on the beam. The amplitude of the signal on the beam will be a function of the capacitances (e.g., a function of the gap between the movable electrode on the beam and the stationary finger electrodes), and the phase of that signal will be the phase of the periodic signal on the nearest fixed electrode. Thus the signal appearing on the beam may be processed to determine the displacement of the beam. This type of accelerometer may be known as an "open loop" accelerometer.

The signal on the beam may be demodulated in a variety of ways. One way of demodulating the signal on the beam is the use of a switched-capacitor demodulator.

Another type of accelerometer employs feedback. An accelerometer using this technique may be known as closed-loop, or force-feedback, or force-balanced accelerometer. In a force-balanced accelerometer, the output voltage of the accelerometer is fed back to the beam to counteract the displacement induced by acceleration. That feedback voltage represents the acceleration of the MEMS device.

As with the open-loop accelerometer, a finger on the beam is centered between two fixed fingers. In the force-balanced accelerometer, the two fixed fingers are at different DC potentials and are driven with AC carrier signals that are preferably 180 degrees out of phase with respect to each other. A DC offset is applied to the beam, resulting in a voltage difference between the beam and each of the fixed fingers. The DC offset is preferably centered between the DC potential of the two fixed fingers.

The voltage difference between the movable finger and a fixed finger results in an electrostatic force that may pull the two fingers towards each other. The attractive electrostatic force is generally described by the following equation:

$$\text{Force} = \epsilon A V^2 / 2d^2$$

where:
(i) $\epsilon$ is the permittivity of the space between the plates, and is a physical constant depending on the material between the fingers;
(ii) A is the surface area of the fingers;
(iii) V is the voltage difference between the fingers; and
(iv) d is the distance between the fingers.

This foregoing equation is accurate for a parallel plate capacitor, and is approximately correct for the finger-type capacitors described herein. The electrostatic force is attractive and proportional to the square of the voltage difference between the fingers, and inversely proportional to the square of the distance between the fingers. As the gap between fingers is reduced, the electrostatic force increases. Accordingly, the electrostatic force is nonlinear with displacement.

The beam in an accelerometer such as those discussed above is subject to a number of forces. Under acceleration, a force will act to displace the beam according to Newton's law: F=MA. Countering this force is the spring force of the tethers, each of which acts to re-center the mass. The spring force is a function of the spring constant (K), and the displacement of the mass (X): F=KX (which may be known as Hooke's law). In addition, the two fixed electrodes will apply electrostatic forces to the beam, but in opposing directions.

As an example, if (1) the potential of the beam of an accelerometer as described above is established, and (2) the potential of one fixed finger is above the potential of the beam, and (3) the potential of the other fixed finger is an equal amount below the beam, then the two electrostatic attractive forces will balance each other when the beam is centered, i.e., in its nominal position. However, when the beam is displaced, the distance from the beam to one of the fixed fingers is reduced, causing an increase in the electrostatic force attracting that fixed finger and the beam. Conversely, the distance between the beam and the other fixed finger is increased, resulting in a reduction in the electrostatic force attracting them.

In normal operation, the force of the tethers is sufficient to return the beam to its nominal position once the acceleration force is removed, because the net electrostatic force is smaller than the spring force.

Under acceleration, the feedback loop (of the noted device using feedback) adjusts the feedback voltage to decrease the bias voltage on the nearest electrode, while increasing the bias voltage on the farthest fixed electrode, to supplement the restorative spring force in opposing the force of the acceleration. The signal at the output terminal is a measure of the force required to re-center the beam, and is therefore proportional to acceleration.

Thus, in the force-balance arrangement, the differential capacitors serve two purposes. First, they allow the displacement of the beam to be measured via the differential capacitance. Second, they apply electrostatic forces to balance the beam.

In both the open-loop and force-balanced devices, there is a potential difference between the beam and one or more fixed fingers, and that difference can become problematic in some circumstances.

In normal operation, the inventors have determined that with a given open loop accelerometer, for example, the displacement of the beam will cause a change in capacitance on the order of one percent to ten percent at full scale. In closed-loop operation, the change is less. Accordingly, the motion of the beam in normal operation is within a predictable range. However, a large acceleration or physical shock may displace the beam more than in nominal operation. Such a displacement means that one of the gaps in the differential capacitor is significantly reduced. As shown in the electrostatic force equation (above), the electrostatic force is non-linear with distance. As the gap is reduced, the force increases. At some point, the force of the electrostatic attraction may exceed the forces acting to return the beam to its nominal position. In that case, the beam may continue moving until the electrostatic force is so great that the beam is captured by, and may even come into contact with, the opposing fixed finger, and cannot return to its normal operating position. This situation is known in the art as "electrostatic capture."

In the prior art, one way to prevent electrostatic capture is by using mechanical stoppers that physically limit the displacement of the beam. However, such a device must have a capacitor gap large enough to accommodate a stopper, and such a gap reduces the sensitivity of the device and degrades signal to noise ratio. Another approach would be to use lower voltages on the members, but that would also reduce the sensitivity of the device and degrade signal to noise ratio.

Alternately, electrostatic capture can be avoided or released by turning off power to the MEMS device completely, thus negating the voltage differential that is powering the electrostatic capture. However, this requires shutting down power to the MEMS device, which may be undesirable.

SUMMARY OF THE INVENTION

In accordance with one embodiment of the invention, one method of minimizing the risk of, or counteracting, electrostatic capture is to reduce or eliminate the voltage difference between the electrodes when the displacement of the movable member exceeds a threshold level. If the voltages on all three electrodes of a differential capacitor are equal, there will be no electrostatic force to attract and capture the movable electrode. The duration of voltage reduction or elimination may be a fixed time, or may be a function of the distance between the members or the voltage difference between the members.

BRIEF DESCRIPTION OF THE DRAWINGS

The foregoing advantages of the invention will be appreciated more fully from the following further description thereof with reference to the accompanying drawings wherein.

DESCRIPTION OF ILLUSTRATIVE EMBODIMENTS

Some illustrated embodiments of the invention reduce the voltage difference between a fixed electrode and a movable electrode of a MEMS device after their separation is below some prescribed distance. Other illustrated embodiments of the invention reduce the voltage difference between a fixed electrode and a movable electrode of a MEMS device after the separation of a second set of electrodes is below some prescribed distance. Accordingly, this voltage reduction should correspondingly reduce electrostatic forces, thus reducing the likelihood of electrostatic capture. Details are discussed below.

Although many MEMS devices, such as accelerometers and gyroscopes, employ capacitors formed by at least one movable electrode and at least one stationary electrode, a variety of such devices may benefit from the present invention. A micromachined accelerometer will be discussed for illustrative purposes.

Figure 1A:
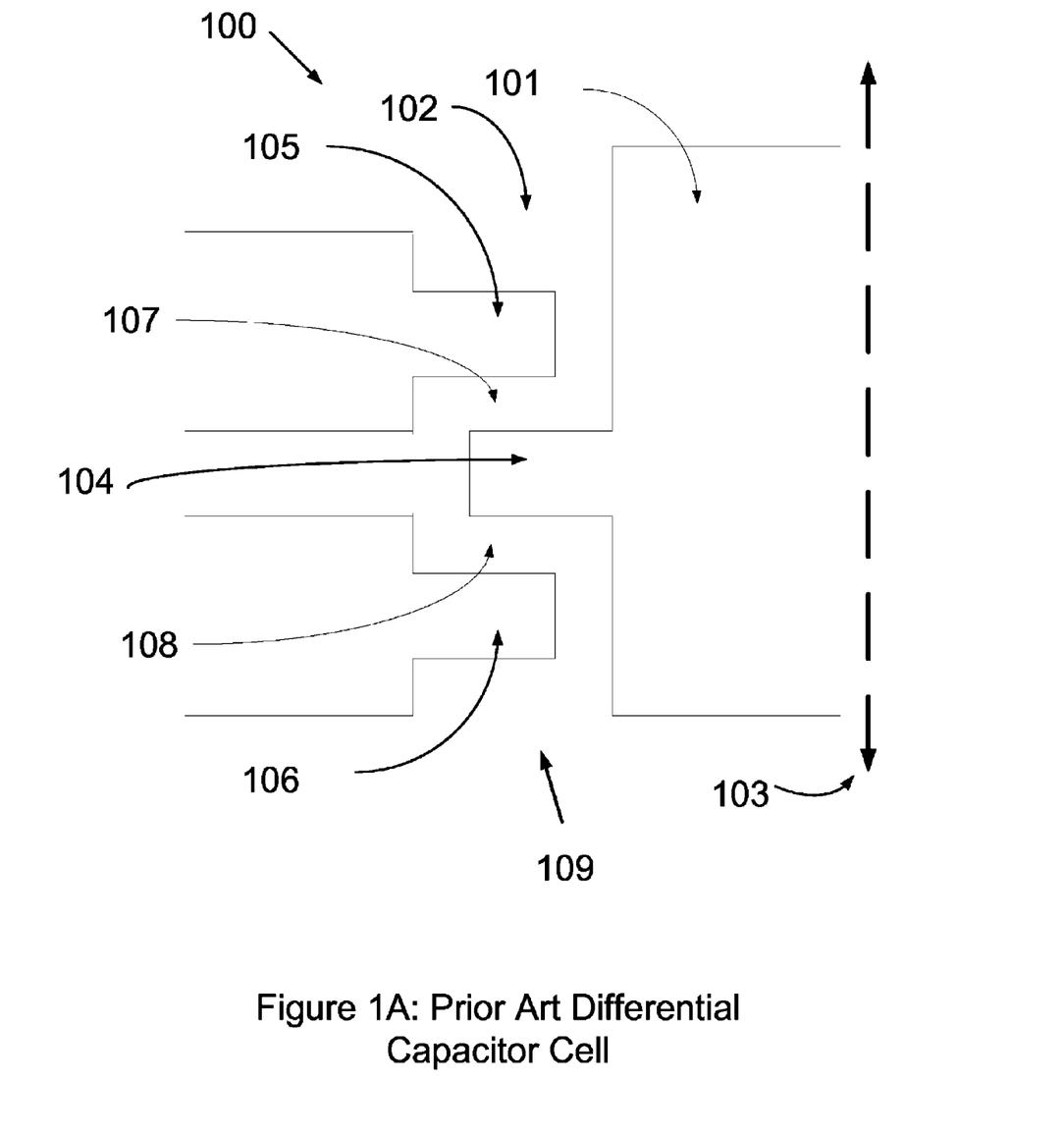
FIG. 1A schematically illustrates a prior art differential capacitor cell.

FIG. 1A schematically illustrates a single cell of a prior art differential capacitor 100 that could be used in an accelerometer. The capacitor 100 has a beam 101 suspended above, and substantially parallel to, a substrate 102 (not shown). The beam 101 is movable along axis 103. The beam 101 includes at least one finger 104 that moves with the beam. Movable finger 104 is an electrode, and a plurality of such movable fingers may be connected to one another to form a larger movable electrode. Adjacent to the beam are fixed fingers 105 and 106, which are also electrodes, and which are electrically independent in illustrative embodiments. The fixed fingers 105 and 106 are meshed or inter-digitated with the movable finger 104 to form a differential capacitor 109 comprising a first capacitor 107 formed from the movable finger 104 and fixed finger 105, and a second capacitor 108 formed from the movable finger 104 and fixed finger 106.

When a force is applied to the substrate 102 along axis 103, the substrate 102 and fixed fingers 105 and 106 move in the direction of the applied force, while the beam 101 inertially, at first, remains in its prior position. When the force is in one direction, the separation between movable finger 104 and fixed finger 105 increases, decreasing the capacitance in the first capacitor 107. Conversely, the separation between movable finger 104 and fixed finger 106 decreases, increasing the capacitance in the second capacitor 108. When the force on the substrate 102 is in the opposite direction, the effect on the first and second capacitors 107 and 108 is reversed.

It should be noted that various embodiments apply to MEMS devices with different variable capacitors. For example, illustrations may apply to variable capacitors having one fixed plate and one movable plate. Discussion of a system with two fixed plates this is illustrative and not intended to be limiting.

Figure 1B:
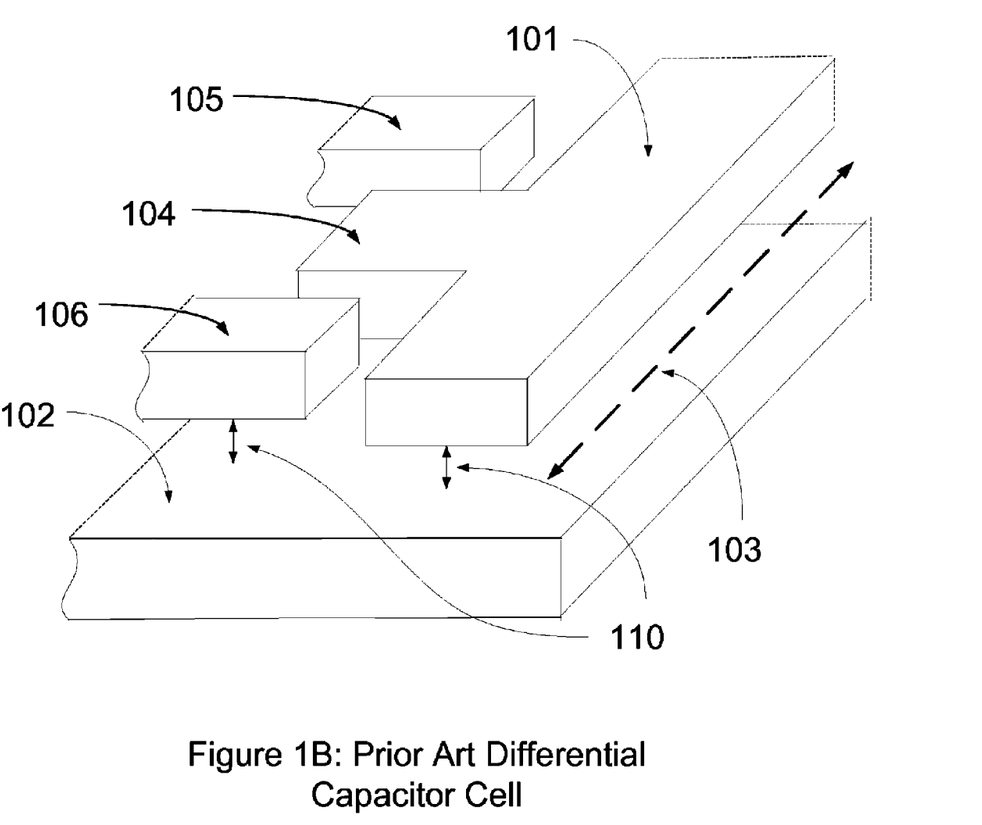
FIG. 1B is a perspective view of the prior art differential capacitor cell of FIG. 1A.

A perspective view of some portions of a differential capacitor cell of FIG. 1A is shown in FIG. 1B. Not all structures are shown. Double-headed arrows 110 schematically illustrate the suspension of the beam 101, and the height of fixed fingers 105 and 106, above substrate 102.

Figure 2:
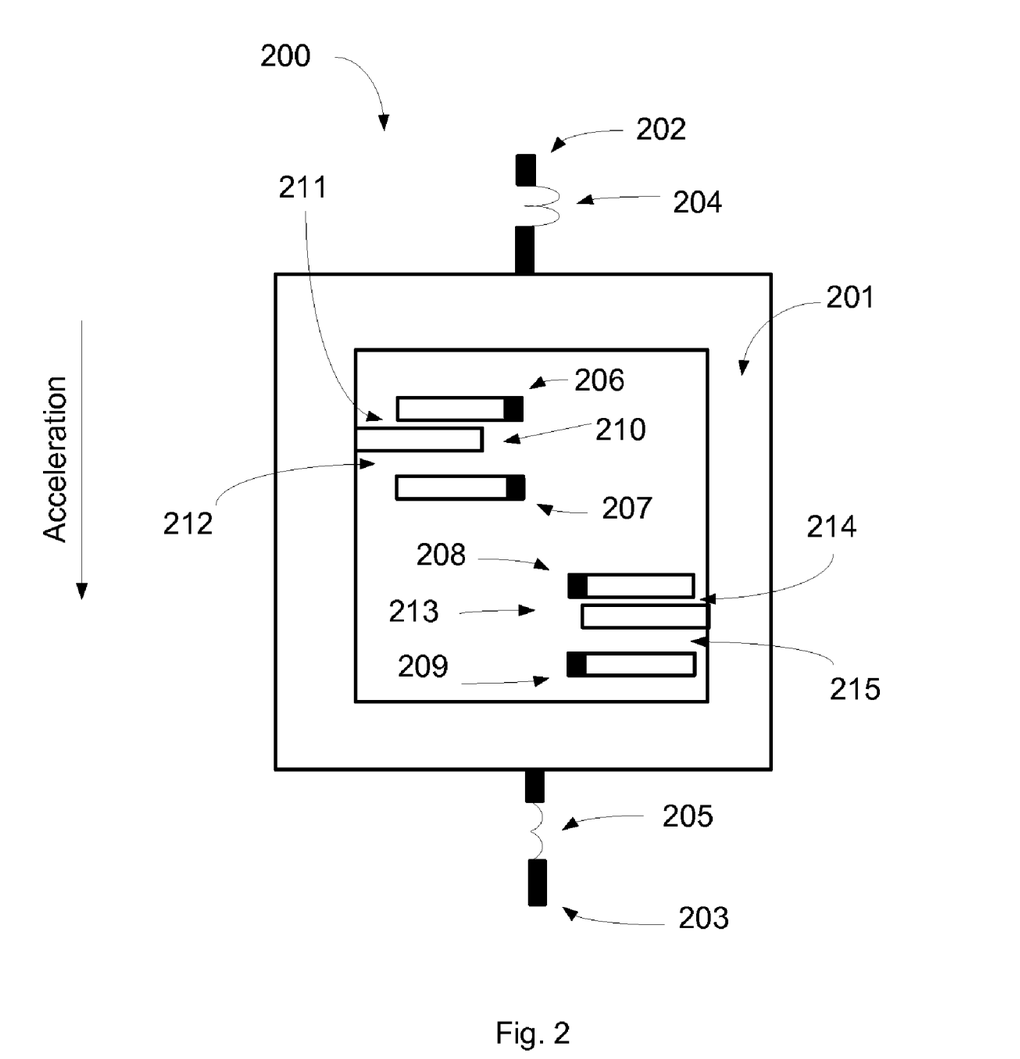
FIG. 2 schematically illustrates an alternate arrangement of movable beam with a finger electrodes, and fixed finger electrodes, in accordance with an illustrative embodiment of the invention.

An alternate arrangement 200 of the beam 201, and illustrative movable fingers 210 and 213 and fixed fingers 206, 207, 208 and 209, is schematically illustrated in FIG. 2. The beam 201 is rectangular, and suspended above a substrate 216 (not shown) from the anchors 202 and 203 by the springs 204 and 205, respectively. The movable fingers 210 and 213 extend from sides of the internal wall of the beam. The stationary fingers 206, 207, 208 and 209 are fixed to the substrate 216 and are in the plane of the beam 201. The fixed fingers 206 and 207, along with movable finger 210, form first capacitor 211 and second capacitor 212, respectively. Similarly, fixed fingers 208 and 209, and movable finger 213, form capacitors 214 and 215, respectively.

Figure 3:
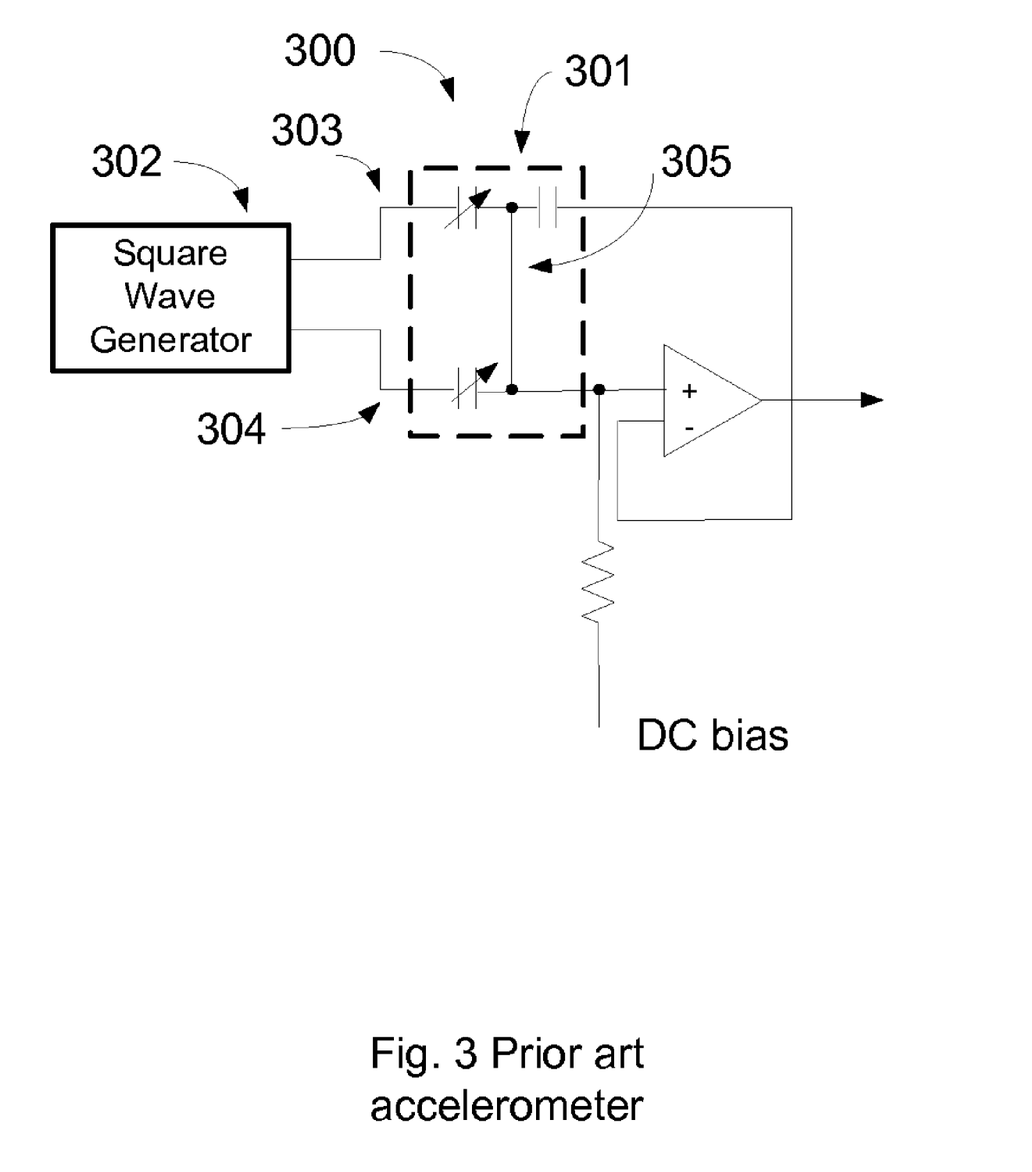
FIG. 3 schematically illustrates a prior art open-loop accelerometer.

An illustrative open-loop accelerometer 300 is schematically illustrated in FIG. 3. Accelerometer 300 includes a differential capacitor cell 301, into which square-wave generator 302 supplies two square wave signals 180 degrees out of phase from each other. The first carrier signal is coupled to a first fixed finger 303, while the other carrier signal is coupled to a second fixed finger 304. If the beam 305 is centered between the first and second fixed fingers 303 and 304, there will be no net coupling of the square waves to the beam 305. However, if the beam 305 is displaced from the center to be closer to the first fixed finger 303, then a square wave will couple to and appear on the beam 305. The signal on the beam 305 will be a square wave with the same phase as the signal on the first fixed finger 303, and its amplitude will be a function of the gap between that fixed finger and the beam. The square wave signal on the beam 305 can be processed by a demodulator (not shown) to produce a DC signal proportional to the displacement of the beam.

Figure 4:
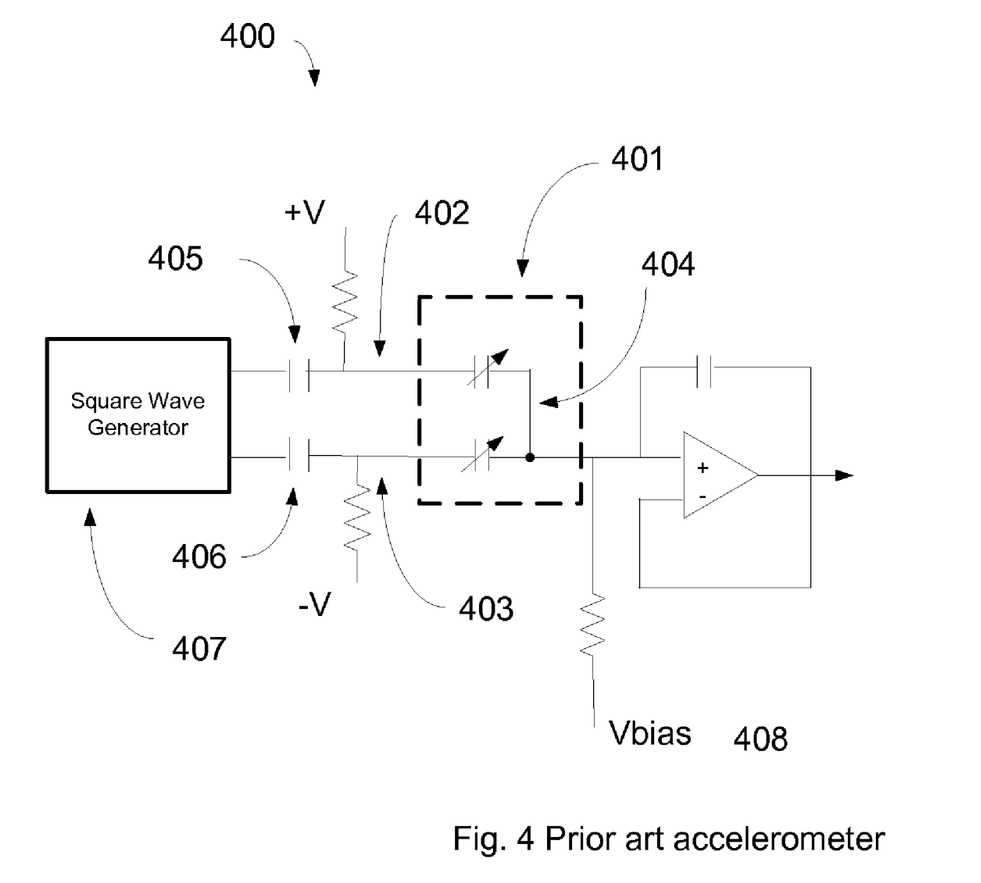
FIG. 4 schematically illustrates a prior art force-balanced accelerometer.

In contrast to the open loop accelerometer, FIG. 4 schematically illustrates a force-balanced accelerometer 400, which has a differential capacitor cell 401. Specifically, the accelerometer 400 has a first fixed finger 402 biased to +V, and a second fixed finger 403 is biased to −V. The beam 404 is biased to a potential 408 centered between +V and −V. The square waves from the square wave generator 407 pass through the two capacitors 405 and 406 of the differential capacitor cell. If the beam 404 is centered between the fixed fingers 402 and 403, there will be no net coupling of the square waves to the beam 404. However, if the beam 404 is displaced from the center to be closer to the first fixed finger 402 (for example), then a square wave couples to and appears on the beam 404. In this illustration, the signal on the beam 404 will be a square wave with the same phase as the signal on the first fixed finger 402, and its amplitude will be a function of the gap between that fixed finger and the beam 404. The resulting signal on the beam 404 can be processed by a demodulator (not shown) to produce a DC signal proportional to the displacement of the beam 404 at the output of the accelerometer 400.

However, as the beam 404 moves closer to one of the fixed fingers 402 or 403, the electrostatic attraction between the beam and that fixed finger increases. To reduce the risk of electrostatic capture, the output of the accelerometer 400 is input to a feedback loop (not shown) that moderates the bias 408 on the beam 404. Because the bias voltages on the fixed fingers 402 and 403 are of opposite polarity, changing the bias on the beam 404 results in reducing the potential difference between the beam 404 and one of the fixed finger electrodes, while increasing the potential difference between the beam and the other one of the fixed finger electrodes. The feedback signal should reduce the electrostatic force between the beam 404 and the nearest fixed finger, and increase the electrostatic force between the beam and the other fixed finger (i.e., in the opposite direction of the beam displacement), thus reducing the risk of electrostatic capture. Of course, depending on the magnitude of the acceleration or severity of the mechanical shock, the beam 404 may continue its travel towards the nearest fixed electrode, so that electrostatic capture may occur anyway.

Figure 5:
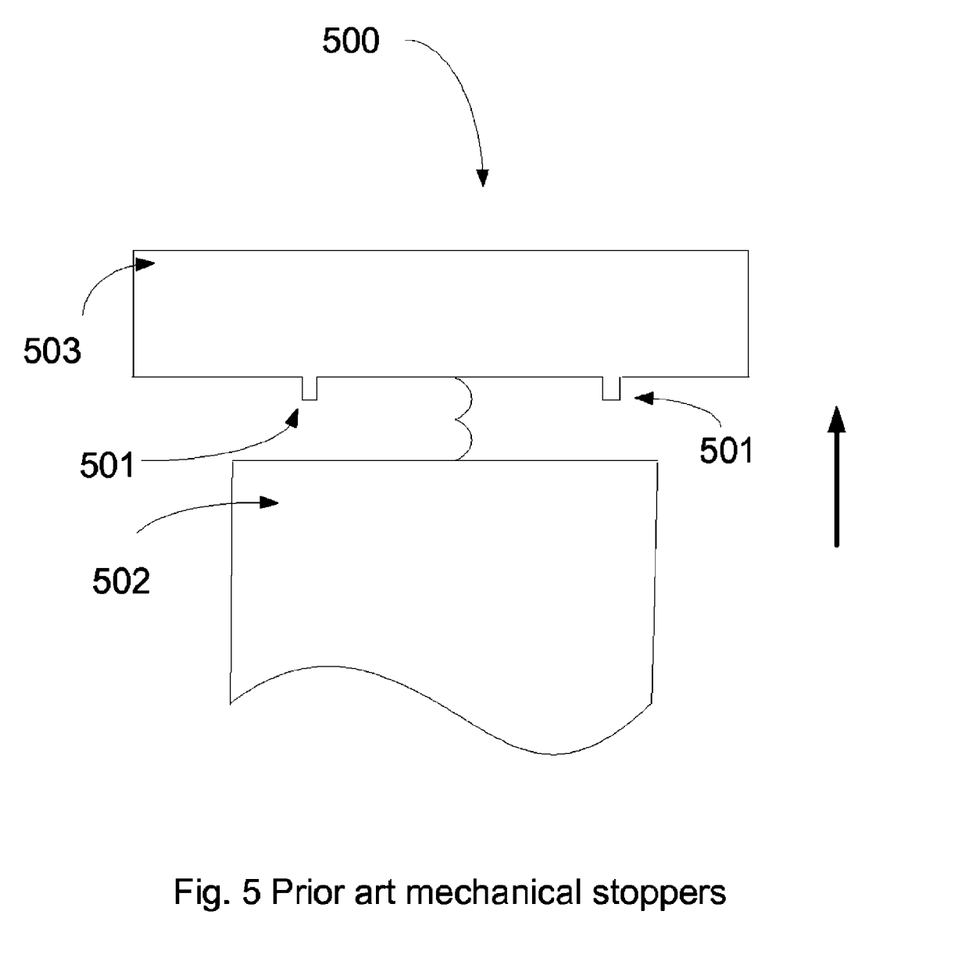
FIG. 5 schematically illustrates prior art mechanical stoppers.

FIG. 5 schematically illustrates a system 500 employing prior art apparatus for addressing electrostatic capture. Mechanical stoppers 501 are fabricated interposed between the beam 502 and the fixed member 503. One or more mechanical stoppers 501 physically prevent the beam 502 from contacting the fixed member 503 when, for example, the beam 502 moves in the direction of the fixed member 503 (for example, as indicated by the arrow). However, the mechanical stoppers 501 themselves may present a risk of electrostatic capture, and so the mechanical stoppers 501 are generally created close the minimum size allowed by the fabrication process (i.e., minimum feature separation) to minimize the surface area presented to the beam 502, and thereby minimize the electrostatic force. The use of one or more mechanical stoppers 501 generally dictates that the nominal gap between the fixed member 503 and the beam 502 be large enough to accommodate the mechanical stoppers 501 and still allow a sufficient range of motion by the beam 502. A larger gap reduces sensitivity and degrades signal to noise ratio in the coupled signal. Also the mechanical stopper approach is only a partial solution—if the voltage difference between the beam 502 and the fixed member 503 is great enough, the beam 502 can be captured anyway.

Figure 6:
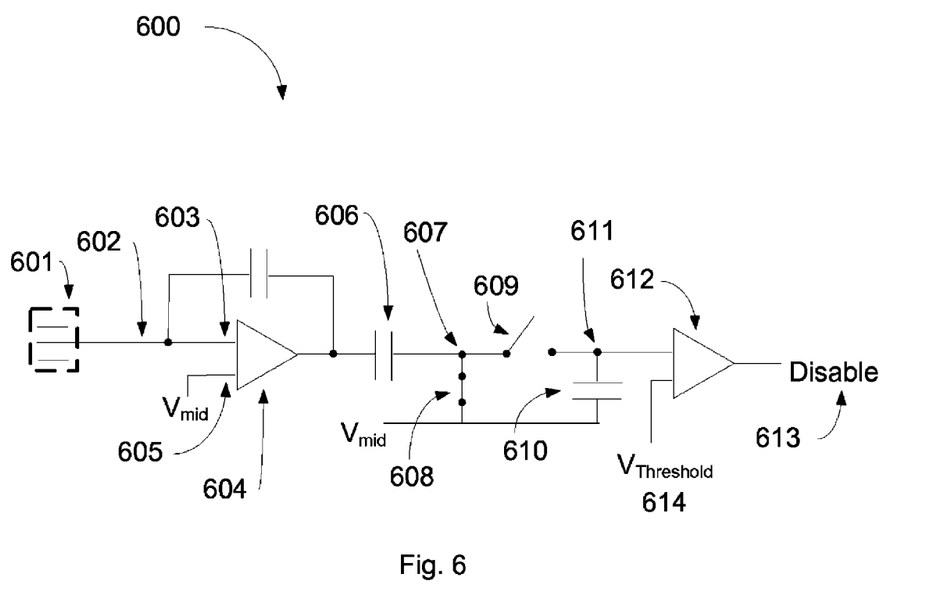
FIG. 6 schematically illustrates a switched-capacitor demodulator, in accordance with an illustrative embodiment of the invention.

FIG. 6 schematically illustrates a switched-capacitor demodulator 600 using correlated double sampling to demodulate the signal from a differential capacitor cell 601 when driven by a square wave. The signal from the beam 602 is input to the inverting node 603 of an operational amplifier 604. A DC level ("Vmid") is input to the non-inverting node 605 of the amplifier 604. The DC level is preferably midway between the minimum and maximum values of the square wave that drives the fixed fingers of differential capacitor 601. The output of the amplifier 604 produces a square wave proportional to the square wave on the beam 602. The output signal of the amplifier 604 is coupled to the first terminal of capacitor 606. The second terminal of capacitor 606 is connected to node 607.

Figure 7:
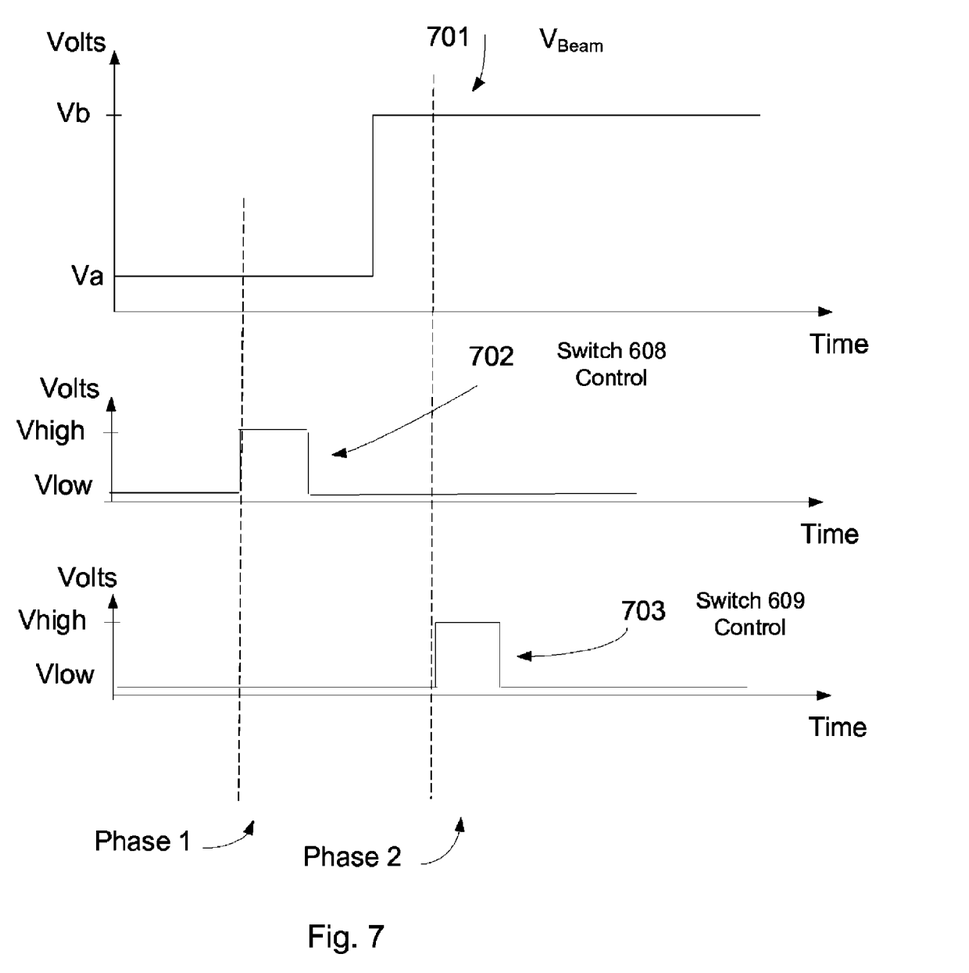
FIG. 7 shows exemplary waveforms from the switched-capacitor demodulator of FIG. 6, in accordance with an illustrative embodiment of the invention.

In illustrative embodiments, the switched-capacitor demodulator 600 is operated in a two-phase cycle, where the two phases correspond to the alternate phases of the square wave driving the fixed fingers of differential capacitor cell 601. For illustrative purposes, the signal on the beam 602 will be at its low voltage (Va) during the first phase of operation, and transition to its high voltage (Vb) for the second phase of operation, as illustrated in FIG. 7.

In the first phase, a first switch 608 is closed to connect the node 607 to an electrical potential equal to Vmid, and a second switch 609 is open. The circuit of FIG. 6 is illustrated in this configuration. Thus in the first phase, the node 607 is set at Vmid.

In the second phase of operation, the first switch 608 is opened, and because no current can flow through the first capacitor 606, the voltage at the first node 607 rises by the difference between Vb and Va, so that the voltage on the first node 607 becomes Vmid+Vb−Va. Next, the second switch 609 is closed, and current flows from the first capacitor 606 to the second capacitor 610. If the first capacitor 606 and the second capacitor 610 are of equal value, and if the second capacitor 610 is initially uncharged, the current flow will distribute the charge equally on those two capacitors 606 and 610 (i.e., until equilibrium is reached). If the second capacitor 610 is initially uncharged, then the initial voltage at the second node 611 will be Vmid. In the first cycle of operation of demodulator 600, the addition of charge to the second capacitor 610 will raise the voltage at the second node 611 to be halfway between Vmid and Vmid+Vb−Va.

If the displacement of the beam 602 remains constant, then each successive cycle of the demodulator 600 will add charge to the second capacitor 610, with the result that the voltage at the second node 611 steps closer to Vmid+Vb−Va. Eventually, the voltage across capacitor 610 approaches the peak-to-peak voltage of the square wave on the beam 602 (Vb−Va), and therefore the voltage at the second node 611 represents that peak-to-peak voltage (even though it may also include a DC bias from Vmid), which is proportional to the displacement of the beam 602.

The voltage at the second node 611 is input to a comparator 612, and compared to a threshold voltage 614. The threshold voltage 614 represents the displacement of the beam 602 at which the risk of electrostatic capture exceeds the acceptable tolerance, as determined by the system designer. When the voltage at node 611 representing the beam displacement exceeds the threshold voltage 614, the comparator 612 generates the disable signal 613. The circuit of FIG. 6, when used in conjunction with a capacitor whose capacitance varies as a function of the displacement of a MEMS beam, is an example of a way to monitor the displacement of the MEMS beam. In some embodiments, the disable signal 613 may be used to control the operation of one or more driver circuits, as illustrated more fully below.

As noted above, FIG. 7 shows exemplary waveforms from the switched-capacitor demodulator 600 of FIG. 6. The top waveform 701 illustratively shows an exemplary output of the amplifier 604, showing one cycle of a square wave from the beam 602, with minimum voltage Va and peak voltage Vb. The second waveform 702 shows a switching signal controlling the closing and opening of the first switch 608, wherein a high signal closes the switch. The third waveform 703 shows a switching signal controlling the closing and opening of the second switch 609, wherein again a high signal closes the switch. The dashed lines illustrate time of closing of the first switch 608 and second switch 609 in the first phase and the second phase, respectively. This timing is illustrative only.

Figure 8A:
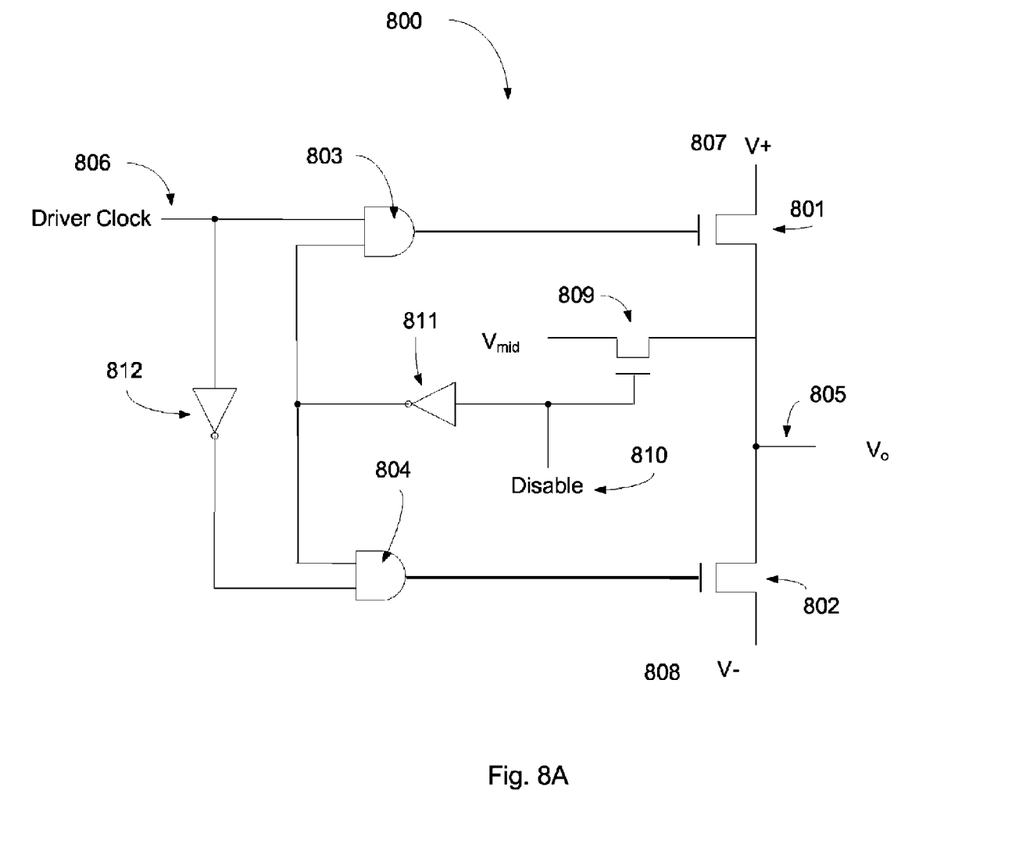
FIG. 8A schematically illustrates an electrode bias driver circuit, in accordance with an illustrative embodiment of the invention.

An illustrative electrode driver circuit 800 used to drive a fixed finger (for example, finger 105 of FIG. 1) in a differential capacitor (for example, differential capacitor 100 of FIG. 1) in accordance with an illustrative embodiment of the invention is schematically shown in FIG. 8A. A first transistor 801 and a second transistor 802 are arranged in series between a first voltage rail 807 and a second voltage rail 808. The gate of the first transistor 801 is driven by an input square wave from the AND gate 803, while the gate of the second transistor 802 is driven by the complement of that input square wave, created by the inverter 812 along with the AND gate 804. The transistors are connected at a node 805, which is the output of the driver circuit 800. In normal operation, the input square wave 806 causes the output node 805 to be coupled, alternately, to the first voltage rail 807, and then the other voltage rail 808. Thus, in normal operation, the output node 805 of the driver 800 produces a square wave in phase with the input square wave 806, but with an amplitude extending between the first rail 807 and the second rail 808. A similar circuit may drive the other fixed finger of a differential capacitor, but the output of that circuit is preferably the inverse of (or 180 degrees out of phase with) the output of the first driver described above.

In illustrative embodiments, to minimize electrostatic force when the distance between a movable electrode (for example, finger 104 of FIG. 1) and a fixed electrode (for example, finger 105 of FIG. 1) is less than a predetermined threshold distance, the driver 800 drives the fixed electrode to a voltage that is nearer to, and preferably the same as (e.g., Vmid), the voltage on the movable beam (for example, beam 101 FIG. 1). To that end, a third transistor 809 is illustratively coupled to Vmid. When the Disable signal 810 goes high, the output of the driver 800 can be set to Vmid by coupling Vmid to the output node 805 through the third transistor 809. In the preferred embodiment, the Disable signal 810 indicates that the beam has moved unacceptably close to a fixed finger (as determined by the system designer), such as the output signal 613 produced, for example, by switched-capacitor demodulator 600.

First transistors 801 and second transistor 802 are disabled because the inverse of the Disable signal 810 goes low at the AND gate 803 and the AND gate 804 due to the inverter 811. In this way, the potential of a fixed finger (e.g., 105) of a differential capacitor can be set to Vmid. Because the movable finger (e.g., 104) is already illustratively biased to Vmid, setting the fixed finger (e.g., 105) to Vmid eliminates the electrostatic forces arising from differences in potential between them. In other words, the voltages differences on the members are removed. In a preferred embodiment, each fixed finger would have its own driver.

Alternately, only the bias of the nearest fixed finger could be set to Vmid, which would eliminate the dominant electrostatic force, while leaving the counteracting electrostatic force from the other fixed finger to act to pull the movable beam back in the direction of their nominal position.

In an alternate embodiment, the driver output could be set to any signal, as long as an identical signal was imposed on the other members of the differential capacitor, so that the voltage difference between the members is at or near zero at any given moment.

Figure 8B:
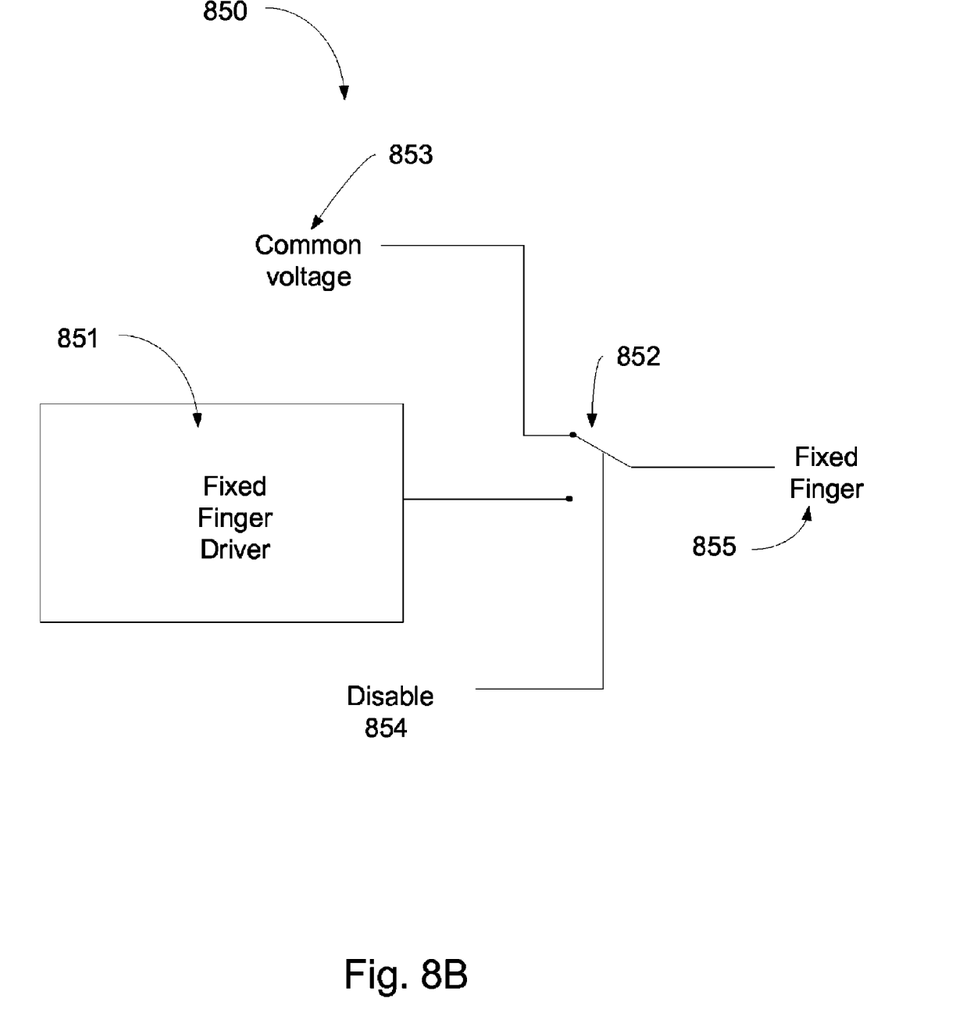
FIG. 8B schematically illustrates a driver capable of connecting the driven electrode to a common voltage, in accordance with an illustrative embodiment of the invention.

FIG. 8B schematically illustrates a generic electrode driver circuit 850, where the output of the finger driver 851 is normally connected to the finger 855, but that output can be interrupted by a switch 852. The switch 852 is controlled by the Disable signal 854, and connects the output 855 to the finger driver 851 when the Disable signal 854 is low, and to common voltage or signal 853 when the Disable signal 854 is high.

Figure 9:
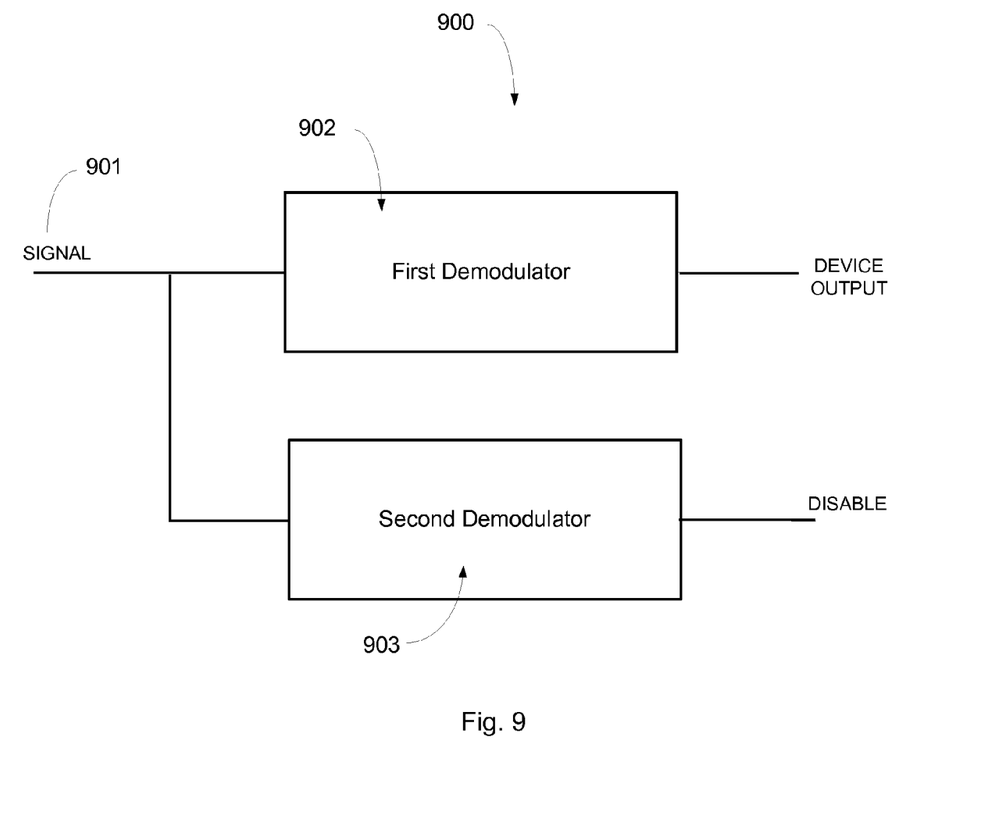
FIG. 9 schematically illustrates an accelerometer system according to an embodiment of the present invention.

A portion of an accelerometer system 900 according to a preferred embodiment of the present invention is schematically illustrated in FIG. 9. By its nature, the accelerometer system 900 measures the displacement of the movable beam (not shown) using a demodulator such as the first demodulator 902, and so illustrative embodiments of the present invention could be implemented by monitoring the output of the first demodulator 902. However, a second demodulator 903 processing the output 901 of the movable finger may offer advantages over using the first demodulator 902. For example, a second demodulator 903 could be made to run at a quicker speed, or greater bandwidth, to more quickly recognize and react to excess displacement of the beam.

In a differential capacitor, the movable finger could make an unacceptably close approach to either of the two fixed fingers. Therefore, each fixed finger of a differential capacitor could be monitored by a demodulator, or the output of a single demodulator could be monitored by two comparators—one for detecting displacement in one direction, and the other for detecting displacement in the other direction. Accordingly, an accelerometer that measures acceleration in only one axis could have two detectors. Similarly, an accelerometer that measures acceleration in two axes could have four detectors, and an accelerometer that measures acceleration in three axes could have six detectors.

If a detector generates a disable signal, the system could disable only the differential capacitor that is the source of the problem, or the system could disable all differential capacitors, or any subset of them. Disabling all (or a subset of all) of the differential capacitors could be beneficial, for example, if the beam is capable of moving in more than one direction, in which case an unacceptable displacement in one direction may imply an unacceptable displacement in another direction. For example, the inventors have found that if a mechanical shock causes a displacement in one direction, the impact of that shock is likely to appear on multiple axes. The inventors have also found that if a mechanical shock produces a displacement in one axis, the beam is likely to oscillate (or ring) back and forth, so a preferred approach is to disable all differential capacitors for at least some period of time. In any event, if one axis is experiencing an unacceptable displacement, it is unlikely that a measurement by any of the differential capacitors will provide a reliable result, and so the preferred approach is to disable all differential capacitors if any one of them is experiencing an unacceptable displacement. To this end, if an accelerometer system includes a plurality of detectors, the outputs of the detectors in some embodiments may be subject to a logic OR function, so that if any detector indicates an unacceptable displacement, the disable signal is generated.

In another alternate embodiment of the present invention, one variable capacitor could be used to monitor excess displacement of a beam, and then the voltage on one or more other capacitor's electrodes could be changed as a function of the displacement. In other words, when a monitoring circuit detects unacceptable displacement of the beam using one variable capacitor, it may cause the reduction of the voltage differential on one or more other capacitors. For example, in one embodiment, a two-axis accelerometer may have one differential capacitor to sense the displacement of the beam in the X-axis, and a second differential capacitor to sense the displacement of the beam in the Y-axis. In such an accelerometer, if the X-axis sensing capacitor detects an unacceptable displacement, the accelerometer could cause the reduction of the voltage differentials in both the X-axis sensing capacitor and the Y-axis sensing capacitor.

In another example, a variable capacitor could be dedicated to monitoring the displacement of the beam, even if that dedicated capacitor is not itself in danger of electrostatic capture. In such an embodiment, the nominal distance between the plates of the dedicated variable capacitor (i.e., the distance between the plates when the beam is not displaced from its nominal position) can be greater than the nominal distance between the electrodes of the MEMS device's other differential capacitors. In this way, the plates of the dedicated variable capacitor will remain separated even when the electrodes of one of the MEMS device's other differential capacitors are too close, or are even the victims of electrostatic capture. The voltages on the plates of such a dedicated variable capacitor could be maintained even when the voltages on the electrodes of the MEMS device's other differential capacitors have been reduced. In this way, the dedicated variable capacitor may continue to monitor the displacement of the beam (i.e., act as part of a displacement sensor) even while one or more of the MEMS device's other differential capacitors are inactivated.

Figure 10:
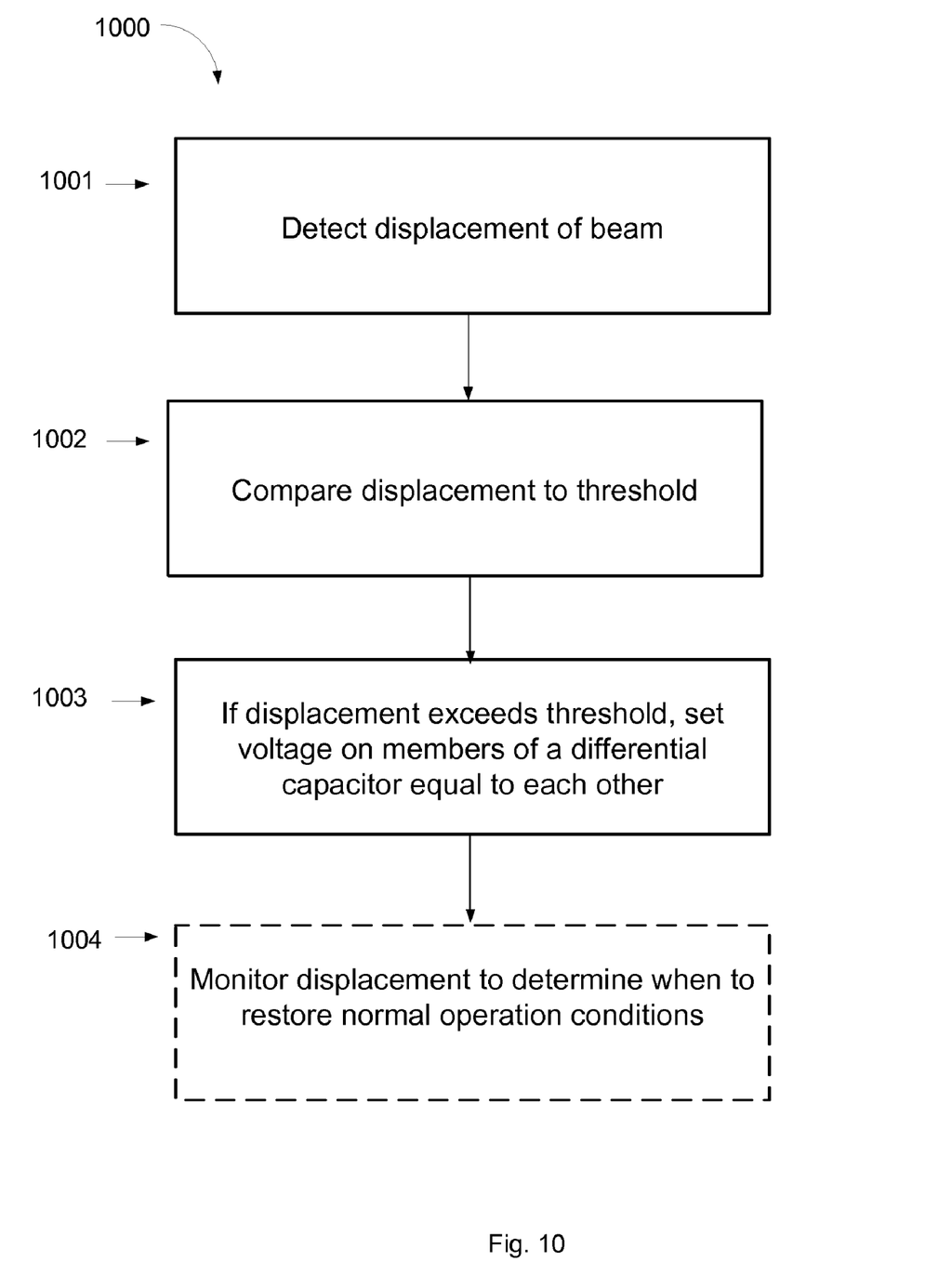
FIG. 10 schematically illustrates a method of preventing electrostatic capture, in accordance with an illustrative embodiment of the invention.

A method 1000 of preventing electrostatic capture according on one embodiment of the present invention is shown in FIG. 10. In step 1001, the displacement of the movable beam is detected. In step 1002, the displacement is compared to a threshold. If the measured displacement exceeds the threshold, the voltage on the three electrodes of a differential capacitor are made equal in step 1003. In optional step 1004, the displacement is monitored until the displacement returns to an acceptable range, at which time normal operating conditions are restored. In some embodiments, the variable capacitor used to sense the displacement of the beam is the same capacitor whose voltage differential is reduced. In other embodiments, the variable capacitor used to sense the displacement of the beam is a different capacitor than capacitor whose voltage differential is reduced.

The monitoring of the displacement of the beam that occurs after an unacceptable displacement is detected may be done in a variety of ways. In one embodiment, after a period of time, the voltage differential is applied briefly to detect whether the displacement of the beam still exceeds the threshold. If so, the voltages are removed again. If not, normal operating conditions are restored. In another embodiment, the voltages are removed for a predetermined period of time. The period may be established by the system designer, or may be determined by operating conditions. In some embodiments, a monitoring capacitor may remain active while other variable capacitors are disabled.

In an alternate embodiment, the amount of time that the voltage is removed is determined using a low pass filter. The demodulators, such as demodulator 903, may have a time constant associated with them. As such, in the event of an over-range displacement, the voltage between the fixed and movable fingers is set to zero, which causes the demodulator output to decay exponentially towards zero, eventually crossing below the threshold.

In some embodiments, the threshold for restoring normal operation may be different than the threshold for disabling normal operation.

Rather than setting the voltage differential between electrodes to zero, some embodiments reduce the voltage difference to a low voltage, preferably close to zero. In this way, the electrostatic force is reduced and the operation of the device is improved, but without having to entirely eliminate the voltage difference.

Although the above discussion discloses various exemplary embodiments of the invention, it should be apparent that those skilled in the art can make various modifications that will achieve some of the advantages of the invention without departing from the true scope of the invention.

What is claimed is:

1. An electrostatic capture mitigation method for a MEMS device having a movable beam and a variable capacitor, the variable capacitor comprising a second electrode and a movable electrode that moves in response to displacement of the movable beam, the movable electrode having an associated first voltage, the second electrode having an associated second voltage, the method comprising:
    monitoring the displacement of the movable beam along at least one axis; and
    reducing the voltage differential between the movable electrode and the second electrode if the displacement of the movable beam exceeds a first predetermined threshold distance.

2. The method as defined by claim 1 wherein reducing comprises reducing the voltage differential to substantially zero volts.

3. A method according to claim 1, wherein reducing the voltage further comprises:
    maintaining the voltage at a reduced level for a fixed period of time.

4. A method according to claim 1, further comprising:
    maintaining the voltage differential at a reduced level at least until the displacement of the beam is decreased to a distance less than or equal to the first predetermined threshold distance.

5. A method according to claim 1, further comprising:
    maintaining the voltage differential at a reduced level at least until the displacement of the beam is less than a second predetermined threshold distance.

6. The method of claim 5 wherein the first predetermined threshold distance is greater than the second predetermined threshold distance.

7. The method of claim 1 wherein the MEMS device comprises a plurality of variable capacitors,
    further wherein reducing the voltage differential comprises reducing the voltage differential within at least two of the plurality of variable capacitors.

8. A MEMS device comprising:
    a movable beam that is movable along at least one axis;
    a variable capacitor comprising a movable electrode that moves relative to a second electrode in response to displacement of the movable beam along at least one axis;
    a voltage circuit for applying a first voltage signal to the movable electrode and a second voltage signal to the second electrode;
    a monitor having a monitor output, the monitor monitoring the displacement of the beam along at least one axis; and
    a voltage reducing circuit operatively coupled with the monitor output and at least one of the movable electrode and the second electrode, the voltage reducing circuit reducing the differential between the first and second voltage signals in response to a signal on the monitor output indicating that the displacement of the beam is greater than or equal to a predetermined threshold value.

9. The MEMS device of claim 8 wherein the differential capacitor further comprises a third electrode such that the movable electrode is positioned between the second and third electrodes; and wherein the voltage circuit applies a third voltage signal to the third electrode.

10. The MEMS device of claim 9 wherein the voltage reducing circuit reduces the differential between the first and third voltage signals in response to a signal on the monitor output indicating that the displacement of the beam is greater than or equal to a predetermined threshold value.

11. The MEMS device of claim 9 further comprising an output processing circuit coupled with the movable electrode, wherein the output processing circuit provides an output that is independent of the monitor output.

12. A MEMS device comprising:
    a movable beam;
    a variable capacitor comprising a movable electrode that moves relative to a second electrode in response to a displacement of the movable beam;
    a voltage circuit for applying a first voltage signal to the movable electrode and a second voltage signal to the second electrode;
    means for determining the displacement of the beam; and
    means for reducing the voltage difference between the movable electrode and the second electrode when the displacement of the beam is greater than or equal to a predetermined threshold distance.

13. A MEMS device according to claim 12 wherein the determining means comprises a circuit operating on the output signal of the MEMS device.

14. A MEMS device according to claim 12 wherein the determining means comprises a circuit that measures the displacement of the movable electrode from its nominal position.

15. A MEMS device according to claim 12 wherein the variable capacitor further comprises a third electrode.

16. A MEMS device according to claim 15 wherein the voltage circuit further comprises a circuit for applying a third voltage signal to the third electrode.

* * * * *